(12) United States Patent
Hong et al.

(10) Patent No.: US 8,269,293 B2
(45) Date of Patent: Sep. 18, 2012

(54) SPIN TRANSISTOR AND METHOD OF OPERATING THE SAME

(75) Inventors: Ki-Ha Hong, Cheonan-si (KR);
Sung-Hoon Lee, Yongin-si (KR);
Jong-Seob Kim, Hwaseong-si (KR);
Jai-Kwang Shin, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 99 days.

(21) Appl. No.: 12/742,221

(22) PCT Filed: Nov. 4, 2008

(86) PCT No.: PCT/KR2008/006477
§ 371 (c)(1),
(2), (4) Date: Jun. 2, 2010

(87) PCT Pub. No.: WO2009/061108
PCT Pub. Date: May 14, 2009

(65) Prior Publication Data
US 2010/0271112 A1 Oct. 28, 2010

(30) Foreign Application Priority Data

Nov. 9, 2007 (KR) .......................... 10-2007-0114192
Oct. 1, 2008 (KR) .......................... 10-2008-0096725

(51) Int. Cl.
*H01L 29/82* (2006.01)
(52) U.S. Cl. ........ 257/421; 257/422; 257/423; 257/427; 438/3; 327/534
(58) Field of Classification Search .................. 257/258, 257/421–427; 438/3; 327/534
See application file for complete search history.

(56) References Cited

U.S. PATENT DOCUMENTS

| 7,411,235 | B2 | 8/2008 | Saito et al. |
| 7,423,327 | B2 | 9/2008 | Sugahara et al. |
| 7,602,636 | B2 | 10/2009 | Saito et al. |
| 7,608,901 | B2 | 10/2009 | Koo et al. |
| 7,671,433 | B2 | 3/2010 | Sugahara et al. |
| 2003/0170484 | A1* | 9/2003 | Moritomo et al. ............ 428/629 |
| 2003/0179510 | A1* | 9/2003 | Hayakawa ................. 360/324.1 |
| 2003/0197984 | A1* | 10/2003 | Inomata et al. ............ 360/324.2 |

(Continued)

FOREIGN PATENT DOCUMENTS

CN 1768427 5/2006

(Continued)

OTHER PUBLICATIONS

International Search Report for corresponding International Application No. PCT/KR2008/006477.

(Continued)

*Primary Examiner* — Jami M Valentine
(74) *Attorney, Agent, or Firm* — Harness, Dickey & Pierce, P.L.C.

(57) ABSTRACT

Disclosed are a spin transistor and a method of operating the spin transistor. The disclosed spin transistor includes a channel formed of a magnetic material selectively passing a spin-polarized electron having a specific direction, a source formed of a magnetic material, a drain, and a gate electrode. When a predetermined voltage is applied to the gate electrode, the channel selectively passes a spin-polarized electron having a specific direction and thus, the spin transistor is selectively turned on.

29 Claims, 7 Drawing Sheets

U.S. PATENT DOCUMENTS

| | | | |
|---|---|---|---|
| 2004/0004261 A1* | 1/2004 | Takahashi et al. | 257/414 |
| 2005/0282379 A1 | 12/2005 | Saito et al. | |
| 2006/0017080 A1 | 1/2006 | Tanaka et al. | |
| 2006/0043443 A1 | 3/2006 | Sugahara et al. | |
| 2006/0118839 A1* | 6/2006 | Sugahara et al. | 257/295 |
| 2006/0138502 A1 | 6/2006 | Sugahara et al. | |
| 2008/0061332 A1 | 3/2008 | Saito et al. | |
| 2008/0061336 A1 | 3/2008 | Sugahara et al. | |
| 2008/0169492 A1 | 7/2008 | Koo et al. | |
| 2008/0283888 A1 | 11/2008 | Saito et al. | |
| 2008/0308853 A1 | 12/2008 | Sugahara et al. | |
| 2009/0039401 A1 | 2/2009 | Tanaka et al. | |
| 2009/0121267 A1 | 5/2009 | Hong et al. | |

FOREIGN PATENT DOCUMENTS

| | | |
|---|---|---|
| EP | 1 610 391 | 12/2005 |
| JP | 2004-111904 | 4/2004 |
| JP | 2006-032915 | 2/2006 |
| KR | 10-0650416 | 11/2006 |
| KR | 10-2007-0020255 | 2/2007 |
| KR | 10-0832583 | 5/2008 |
| WO | WO 2006/100835 | 9/2006 |

OTHER PUBLICATIONS

Chinese Office Action dated Sep. 16, 2011, issued in Application No. 200880115280.3 and English translation thereof.

European Search Report dated Nov. 25, 2011, issued in Application No. 08848274.0.

Masaaki Tanaka et al., "MOS-Based Spin Devices for Reconfigurable Logic", IEEE Transactions on Electron Devices, IEEE Service Center, Pisacataway, NJ, US, vol. 54, No. 5, May 2007, pp. 961-976.

Satoshi Sugahara, "Spin MOSFETs as a basis for integrated spin-electronics", 2005 5$^{th}$ IEEE Conference on Nanotechnology, IEEE Operations Center, US, Jul. 11, 2005, pp. 296-299.

S.J. Pearton et al., "Advances in wide bandgap materials for semi-conductor spontronics", Materials Science and Engineering R: Reports, Elsevier Sequoia S.A., Lausanne, CH, vol. 40, No. 4, Feb. 28, 2003, pp. 137-168.

Claudia Felser et al., "Spintronics: A Challenge for Materials Science and Solid-State Chemistry", Angew. Chem. Int. Ed. 2007, 46, pp. 668-677.

J. Mathon et al., "Theory of tunneling magnetoresistance of an epitaxial Fe/MgO/Fe(001) junction", Physical Review B, vol. 63, May 10, 2001, pp. 220403-1-220403-4.

W.H. Butler et al., "Spin-dependent tunneling conductance of Fe/MgO/Fe sandwiches", Physical Review B, vol. 63, Jan. 8, 2001, pp. 054416-1-054416-12.

Sebastiaan van Dijken et al., "Room temperature operation of a high output current magnetic tunnel transistor", Appl. Phys. Lett. 80, 3364 (2002); doi: 10.1063/1.1474610, pp. 3363-3366.

* cited by examiner

SPIN TRANSISTOR AND METHOD OF OPERATING THE SAME

PRIORITY STATEMENT

This application claims priority under U.S.C. §119 to Korean Patent Application Nos. 10-2007-0114192 and 10-2008-0096725, filed on Nov. 9, 2007, and on Oct. 1, 2008, in the Korean Intellectual Property Office (KIPO), the entire contents of which are incorporated herein by reference.

BACKGROUND

1. Field

Example embodiments relate to a spin transistor that uses a field effect and a magnetic field effect.

2. Description of the Related Art

When semiconductor devices are manufactured to a nanoscale, the increasing rate of carrier mobility may not keep pace with the increasing rate of the semiconductor devices, and despite the reduction in the size of devices, the power requirement may not be reduced. In order to address these problems, a technique of using electron spin has been proposed.

As such, a spin transistor is turned on due to the movement of spin-polarized electrons, and the power required to move electrons is small and the turn on speed may be faster.

SUMMARY

Example embodiments relate to a spin transistor in which the passage of an injected spin-polarized electron is controlled by controlling a channel.

Example embodiments relate to a method of operating the spin transistor.

According to example embodiments, a spin transistor may comprise a channel formed of a magnetic material selectively passing a spin-polarized electron having a specific direction, a source formed of a magnetic material, a drain, and a gate electrode controlling a magnetization state of the channel to selectively pass the spin-polarized electron injected from the source into the channel.

The channel may be controlled by using an electric field generated due to a voltage applied to the gate electrode in order to control the passing of the spin-polarized electron injected from the source.

The spin transistor may further comprise an insulating material that electrically separates the gate electrode from the channel.

The channel may be controlled by using a magnetic field generated due to a current flowing through the gate electrode in order to control the passing of the spin-polarized electron injected from the source.

The spin transistor may further comprise a second gate electrode that is electrically insulated from the gate electrode and is perpendicular to the gate electrode.

The spin transistor may further comprise a tunnel barrier disposed at least one selected from between the channel and the source and between the channel and the drain.

The tunnel barrier may comprise a first tunnel barrier between the channel and the source and a second tunnel barrier between the channel and the drain.

The source may comprise a ferromagnetic layer disposed on the first tunnel barrier and a metal layer disposed on the ferromagnetic layer.

The source may further comprise a anti-ferromagnetic layer formed between the ferromagnetic layer and the metal layer.

The drain may comprise a magnetic layer disposed on the second tunnel barrier and a metal layer disposed on the magnetic layer.

The magnetic layer of the drain may be formed of a ferromagnetic layer.

The drain may further comprise a anti-ferromagnetic layer between the ferromagnetic layer and the metal layer.

The tunnel barrier may be formed of magnesium oxide or aluminum oxide.

The channel may be formed of a ferromagnetic material, for example, a half metal.

The half metal may comprise at least one material selected from the group consisting of a magnetic oxide, a magnetic material having a double perovskite structure, a magnetic Heusler alloy, a magnetic half Heaulser alloy, and a semiconductor having a half metallic characteristic.

The channel may be formed of a diluted magnetic semiconductor material prepared by doping a semiconductor with a transition metal to obtain a magnetic characteristic.

According to example embodiments, the channel, the source, and the drain may be disposed on the same plane.

According to example embodiments, first tunnel barrier may be separated from the second tunnel barrier on the channel, and the source and the drain may be respectively disposed on the first tunnel barrier and the second tunnel barrier.

According to example embodiments, the source, the channel, and the drain may be disposed vertically to a substrate.

The first tunnel barrier and the second tunnel barrier may be disposed corresponding to each other on opposite surfaces of the channel, the source and the drain may be respectively disposed on the first tunnel barrier and the second tunnel barrier, and the gate electrode may comprise a first gate electrode separated from the source on the channel and a second gate electrode separated from the drain on the channel.

According to example embodiments, a method of operating the spin transistor may comprise injecting spin-polarized electrons from the source; and controlling the magnetization state of the channel by applying an electric field or a magnetic field to the channel to selectively pass the spin-polarized electrons.

The controlling operation may be to apply a predetermined voltage to the gate electrode.

The controlling operation may be to apply a predetermined voltage to each of the gate electrode and a second gate electrode disposed above the gate electrode to be perpendicular to the gate electrode.

The channel may pass among the spin-polarized electrons injected from the source, only a spin electron having a specific spin direction, according to the magnetization state of the channel.

BRIEF DESCRIPTION OF THE DRAWINGS

Example embodiments will be more clearly understood from the following detailed description taken in conjunction with the accompanying drawings. FIGS. 1-8 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings in which example embodiments may be shown. In the drawings, the thicknesses of layers and regions may be exaggerated for clarity. Like reference numerals denote like elements in the drawings and repetitive description thereof will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
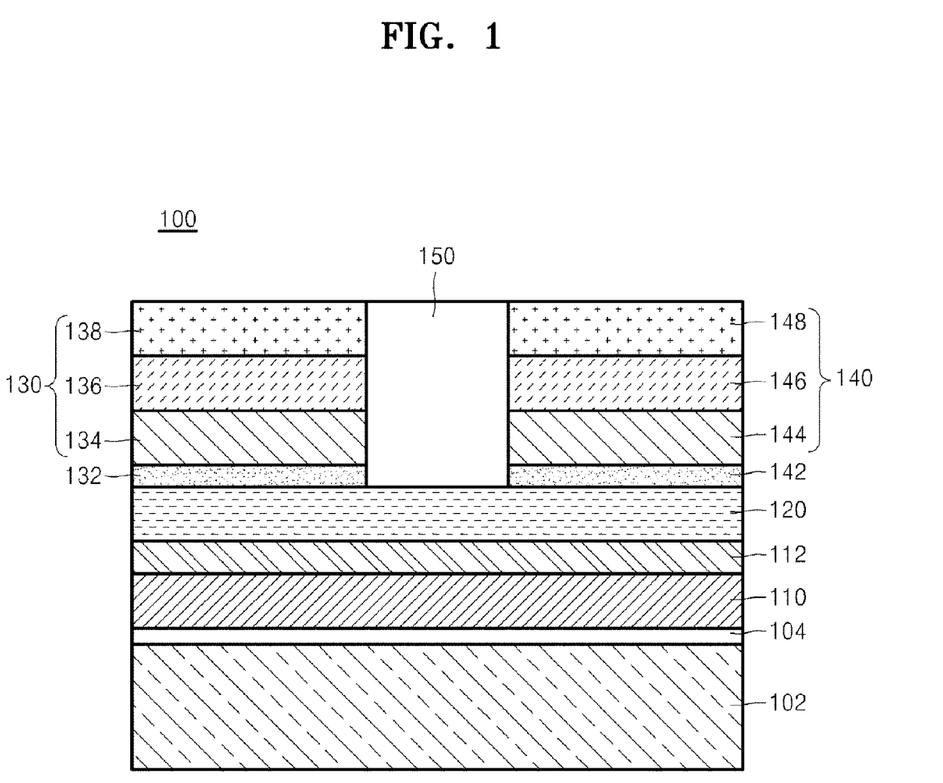
FIG. 1 is a schematic cross-sectional view of a spin transistor according to example embodiments.

FIG. 1 is a schematic cross-sectional view of a spin transistor 100 according to example embodiments. Referring to FIG. 1, an insulating layer 104 and a gate electrode 110 may be formed on a substrate 102. The substrate 102 may be a conventional silicon substrate, and the insulating layer 104 may be formed of silicon oxide. The gate electrode 110 may be formed of Al or polysilicon.

A gate oxide layer 112 and a channel 120 may be sequentially formed on the gate electrode 110. A source 130 and a drain 140, which may be separated from each other, may be formed on the channel 120. The gate oxide layer 112 may be formed of silicon oxide.

An insulating layer 150 may be further formed between the source 130 and the drain 140.

A first tunnel barrier 132 may be formed between the channel 120 and the source 130, and a second tunnel barrier 142 may be formed between the channel 120 and the drain 140. The first tunnel barrier 132 and the second tunnel barrier 142 may be formed in a single layer structure so that the first tunnel barrier 132 and the second tunnel barrier 142 are connected to each other. The first and second tunnel barriers 132 and 142 may be formed of the same material disposed between both magnetization layers in a tunneling magneto resistivity (TMR) device, for example, MgO or $Al_2O_3$. For example, if MgO is used to form the first and second tunnel barriers 132 and 142, a high magneto resistance (MR) ratio may be obtained.

The source 130 may be formed of a magnetic material, for example, a ferromagnetic material. The source 130 may include a ferromagnetic layer 134 on the first tunnel barrier 132 and a metal layer 138 on the ferromagnetic layer 134. In addition, the source 130 may further include a anti-ferromagnetic layer 136 between the ferromagnetic layer 134 and the metal layer 138.

The ferromagnetic layer 134 allows a spin-polarized electron to be easily injected into the source 130.

The anti-ferromagnetic layer 136 fixes the spin direction of the spin-polarized electron of the ferromagnetic layer 134.

The drain 140 may be formed of a normal metal. In addition, the drain 140 may also be formed of a magnetic material, for example, a ferromagnetic material. The drain 140 may include only a metal layer 148. The drain 140 may include a ferromagnetic layer 144 between the second tunnel barrier 142 and the metal layer 148. In addition, the drain 140 may further include a anti-ferromagnetic layer 146 between the ferromagnetic layer 144 and the metal layer 148.

The channel 120 is a passage of a spin-polarized electron between the source 130 and the drain 140. The channel 120 functions as a filter for selectively passing a spin-polarized electron having a specific direction, for example, an up-spin direction or a down-spin direction, injected from the source 130. The filtering function of the channel 120 may vary according to a voltage applied to a gate electrode 110.

The first tunnel barrier 132 filters out an electron having an undesired spin direction to prevent the electron from entering into the channel 120, and the second tunnel barrier 142 filters out an electron having an undesired spin direction to prevent the electron from entering into the drain 140 from the channel 120.

In this case, the spin transistor 100 is a transistor using a field effect.

The channel 120 may be formed of a ferromagnetic material, for example, a half metal. Examples of the half metal include a magnetic oxide, a magnetic material having a double perovskite structure, a magnetic Heusler alloy, a magnetic half Heaulser alloy, and a semiconductor having a half metallic characteristic.

The magnetic oxide may be $CrO_2$, $Fe_3O_4$, NiO, or $TiO_2$.

The chemical composition of the double perovskite structure material may be expressed as $A_2BB'O_6$. A material corresponding to A may be Ca, Sr, or Ba, a material corresponding to B may be a 3d orbital transition metal, for example, Fe and Co, and a material corresponding to B' may be a 4d orbital transition metal, for example, Mo and Re. The double perovskite structure material may be, for example, $Sr_2FeMoO_6$ or $Sr_2FeReO_6$. The Heusler compound may be $Co_2CrAl$.

The magnetic Heusler alloy may include at least one compound selected from the group consisting of $X_2YZ$, $X_2YZ'$, $X_2Y'Z$, and $X_2Y'Z'$ where X includes at least one selected from Co, Fe, and Ru, Y is Cr or Mn, and Z is any one selected from Si, Ge, Sn, Al, Ga, Sb, and Pb. Examples of the magnetic Heusler alloy include $Co_2CrAl$ and $Co_2MnSi$.

The magnetic half Heaulser alloy may be any one alloy selected from NiMnSb, PdMnSb, PtMnSb, CoMnSb, IrMnSb, NiCrSb, FeMnSb, CoCrSb, NiVSb, CoVSb, CoTiSb, NiMnSe, NiMnTe, CoFeSb, NiFeSb, and RhMnSb.

The semiconductor having a half metallic characteristic may be selected from CrAs, MnAs, and CrSe.

The channel 120 may be formed of any one ferromagnetic metal selected from CoFe, CoFeB, Fe, Co, Mn, and Permalloy. The channel 120 may also be formed of a dilute magnetic semiconductor material prepared by doping a semiconductor with a transition metal to obtain a magnetic characteristic. The dilute magnetic semiconductor material may be any one material selected from (In,Mn)As, (Ga,Mn)As, (Zn,Co)O, (Zn,V)O, (Ga,Mn)N, (Ga,Cr)N, (Cd,Mn)$GeP_2$, (Zn,Mn)$GeP_2$, (Ti,Cr)$O_2$, and (Zn,Cr)Se. In this regard, the former materials in parentheses are mother bodies, and the latter materials are doping materials or substituents. Besides, a manganite-based material, such as NiMnSb or $La_{(1-x)}A_xMnO_3$ where A is Ca, Ba or Sr, and $0.2 < x < 0.3$, and a transition metal doped semiconductor such as Cu-doped GaN have also a half metallic characteristic.

The half metal has a down spin electron and an up spin electron, and one spin electron has a semiconductor characteristic due to formation of a band gap near a Fermi level and the other spin electron has a metallic characteristic.

When the source 130 and the drain 140 include the ferromagnetic layers 134 and 144, respectively, the ferromagnetic layers 134 and 144 may be formed to have a same predominant electron spin direction. The ferromagnetic metal may be NiFe alloy, CoFe alloy, CoFeB alloy, Fe, Co, Mn, and Permalloy. The ferromagnetic layers 134 and 144 may have a density of state (DOS) higher in one spin direction than the other spin direction, for example, the density of up-spin electrons may be higher than that of down-spin electrons. However, in a normal metal, the DOS of up-spin electrons and down-spin electrons may be the same, and the drain 120 may be formed of a normal metal.

The anti-ferromagnetic layers 136 and 146 may be formed of FeMn, PtMn, or PtCrMn.

Figure 2:
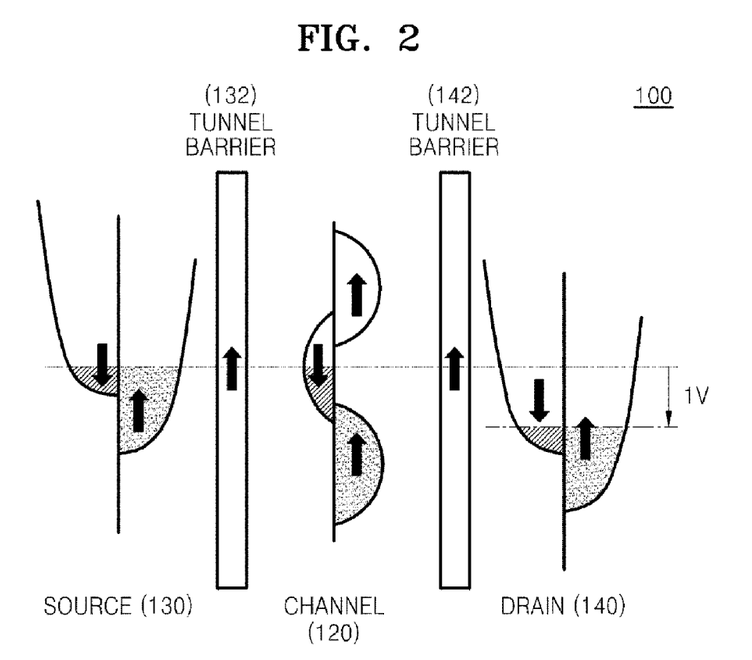
FIGS. 2 and 3 are schematic energy band diagrams of the spin transistor of FIG. 1.
Figure 3:
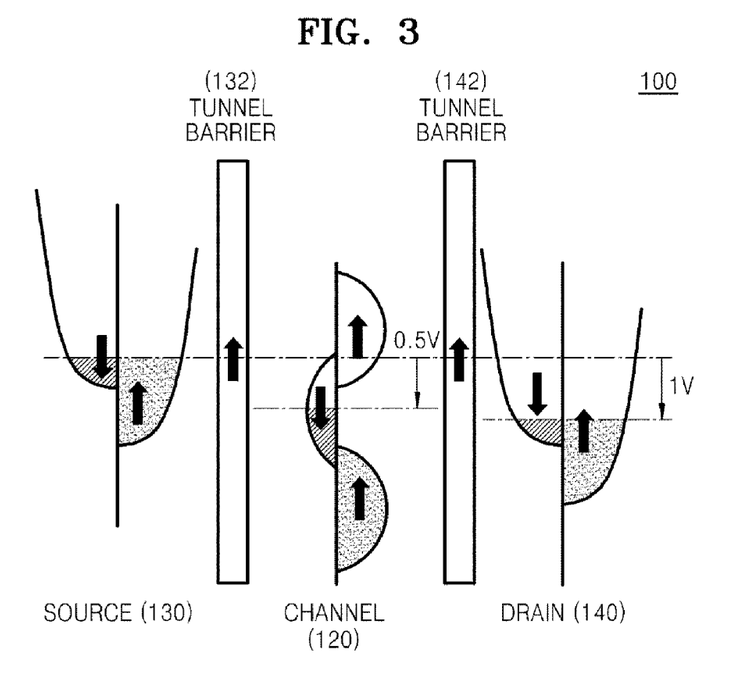

When the channel 120 is formed of a half metal and the source 130 and the drain 140 are formed of a ferromagnetic material, the channel 120 may be formed to have a semiconductor characteristic in a predominant electron spin direction of the source 130 and drain 140. A method of operating the spin transistor 100 of FIG. 1 will now be described with reference to FIGS. 2 and 3. FIGS. 2 and 3 are energy band diagrams of the source 130, the drain 140, and the first tunnel barrier 132 and the second tunnel barrier 142. Like elements in FIGS. 1, 2 and 3, are denoted by like reference numerals, and thus their description will be omitted.

Referring to FIG. 2, the source 130 and the drain 140 are formed of a ferromagnetic metal, and the channel 120 is formed of a half metal. Each of the source 130 and drain 140 is formed to have a predominant up-spin electron, and the channel 120 may have a semiconductor characteristic in an up-spin direction. To move an electron spin from the source 130 to the drain 140, a 1 V bias voltage may be applied to the drain 140 and a ground voltage is applied to the source 130.

In the source 130, down-spin electrons are minor carriers and the amount of the down-spin electrons may be relatively low. The first and second tunnel barriers 132 and 142 (MgO layer) may selectively allow tunneling of up-spin electrons which are major carriers. The channel 120 may block the flow of up-spin electrons from moving to the drain 140 and thus, no current flows in the channel 120. That is, the spin transistor 100 may be in an OFF state. By referring to a current measured in the drain 140, that is, a drain current, it may be determined whether the spin transistor 100 is in an ON state or an OFF state. Referring to FIG. 3, when a gate voltage of 0.5V is applied to the gate electrode 110, a conduction band of the up-spin electrons of the channel 120 may be aligned with the Fermi level in the source 130, and thus, the up-spin electrons in the source 130 may move to the channel 120 through the first tunnel barrier 132, and the up-spin electrons in the channel 120 may move to the drain 140 through the second tunnel barrier 142. Thus, a current may flow in the channel 120 and the spin transistor 100 may be in an ON state.

As described above, spin-polarized electrons may selectively pass through the channel 120 due to the gate voltage, and thus, the spin transistor 100 is turned on. The spin transistor 100 according to example embodiments may have increased charge mobility as compared to a conventional semiconductor device. Also, since the power needed to move spin electrons may be smaller than the power needed to move electrons, the amount of power needed to the operation may be reduced. Accordingly, a relatively small transistor may be manufactured through a scale down.

Figure 4:
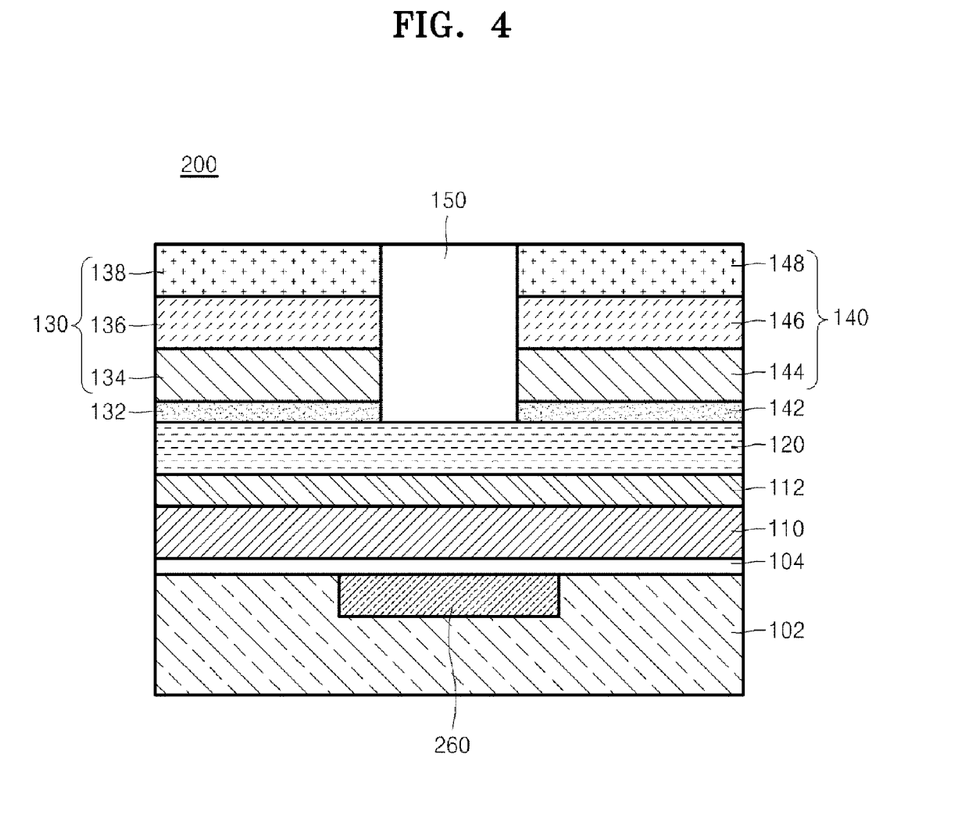
FIG. 4 is a schematic cross-sectional view of a spin transistor according to example embodiments.

FIG. 4 is a schematic cross-sectional view of a spin transistor 200 according to example embodiments. Like elements of the spin transistors 100 and 200 of FIGS. 1 and 4 are denoted by like numeral references and thus, their description will be omitted.

Referring to FIG. 4, a second gate electrode 260 may be formed in a substrate 102. The second gate electrode 260 may be separated from and disposed perpendicular to the gate electrode 110. The gate electrode 110 may be referred as a first gate electrode. A first current applied to the first gate electrode 110 is perpendicular to a second current applied to the second gate electrode 260. By controlling the direction of the first current or second current, the spin direction of the channel 120 may be changed. For example, in the case in which the channel 120 is formed of a ferromagnetic metal, when a magnetic filed is applied to the channel 120 such that main spins of the channel 120 and the source 130 have the same direction, the spin transistor 200 may be turned on, and when a magnetic filed is applied to the channel 120 such that main spins of the channel 120 and the source 130 have different directions, the spin transistor 200 may be turned off.

Figure 5:
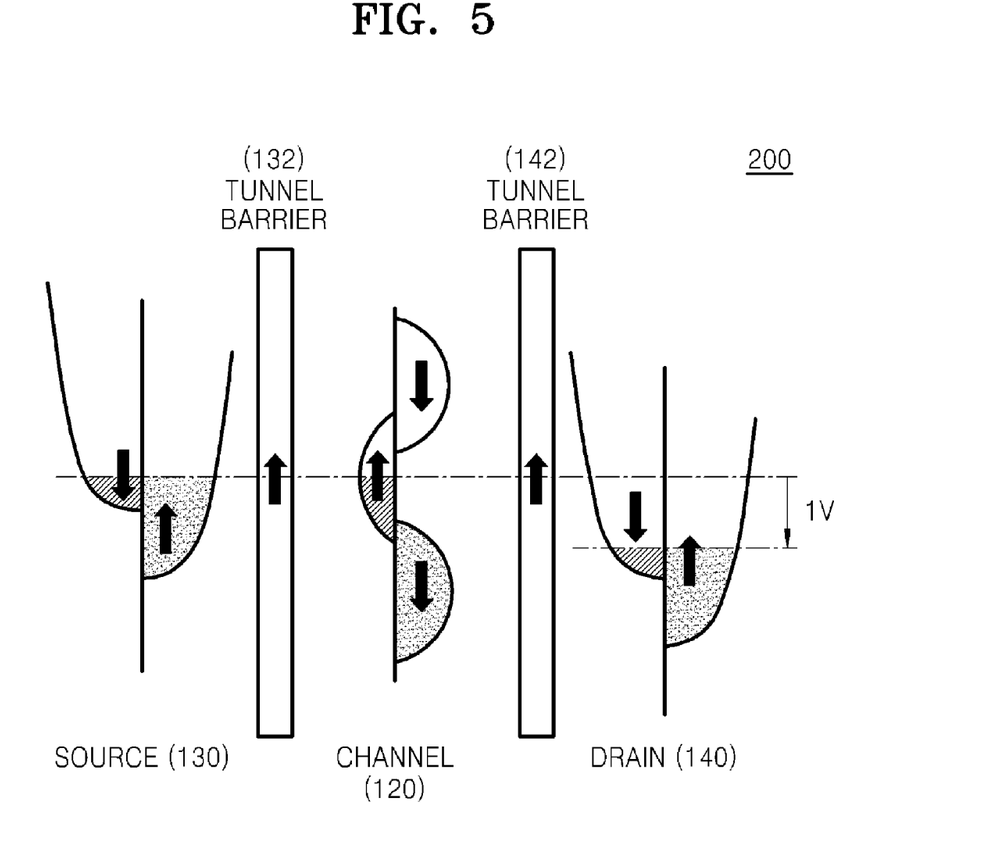
FIG. 5 is a view to explain operation of the spin transistor of FIG. 4.

In the case in which the channel 120 is formed of a half metal, the spin transistor 200 may be turned on or off by controlling the current flowing through the first gate 110 and the second gate 260. For example, when a spin direction having a metallic characteristic is an up-spin direction as illustrated in FIG. 5, the spin transistor 200 may be turned on, and when a spin direction having a metallic characteristic is a down-spin direction as illustrated in FIG. 2, the spin transistor 200 may be turned off.

Thus, the spin transistor 200 may be turned on by using a magnetic field.

Figure 6:
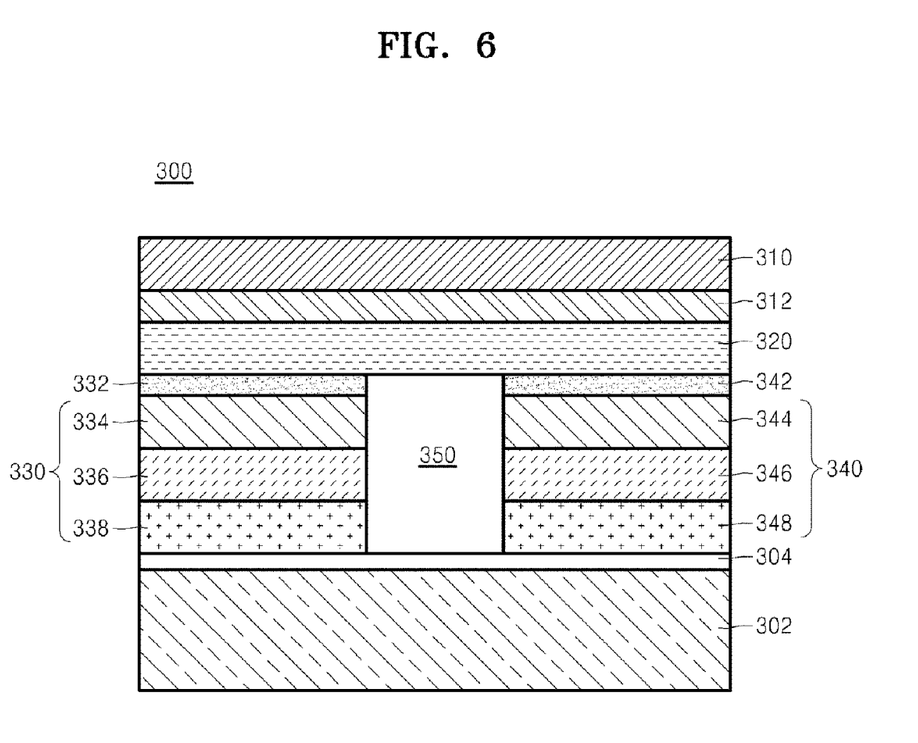
FIG. 6 is a schematic cross-sectional view of a spin transistor according to example embodiments.

FIG. 6 is a schematic cross-sectional view of a spin transistor 300 according to example embodiments. Like elements of the spin transistors 100 and 300 of FIGS. 1 and 6 are denoted by like numeral references and thus, their description will be omitted.

Referring to FIG. 6, an insulating layer 304 may be formed on a substrate 302, and a source 330 and a drain 340, separate from each other, may be formed on the insulating layer 304. An insulating layer 350 may be formed between the source 330 and the drain 340. A first tunnel barrier 332 and a second tunnel barrier 342 may be formed on the source 330 and the drain 340, respectively. A channel 320, a gate insulating layer 312, and a gate electrode 310 may be sequentially disposed in this order on the first tunnel barrier 332 and the second tunnel barrier 342.

In the source 330, a ferromagnetic layer 334, a anti-ferromagnetic layer 336, and a metal layer 338 may be sequentially disposed in this order downward from the first tunnel barrier 332. In the drain 340, a ferromagnetic layer 344, a anti-ferromagnetic layer 346, and a metal layer 348 may be sequentially disposed in this order downward from the second tunnel barrier 342.

The method of operating the spin transistor 300 of FIG. 6 may be substantially the same as that of the spin transistor 100 of FIG. 1 and thus, its description will be omitted.

Meanwhile, in the spin transistor 300 of FIG. 6, a second gate electrode (not shown) may be further disposed above the gate electrode 310 to cross the gate electrode 310, and thus, a spin transistor that is driven by a magnetic field may be obtained.

Figure 7:
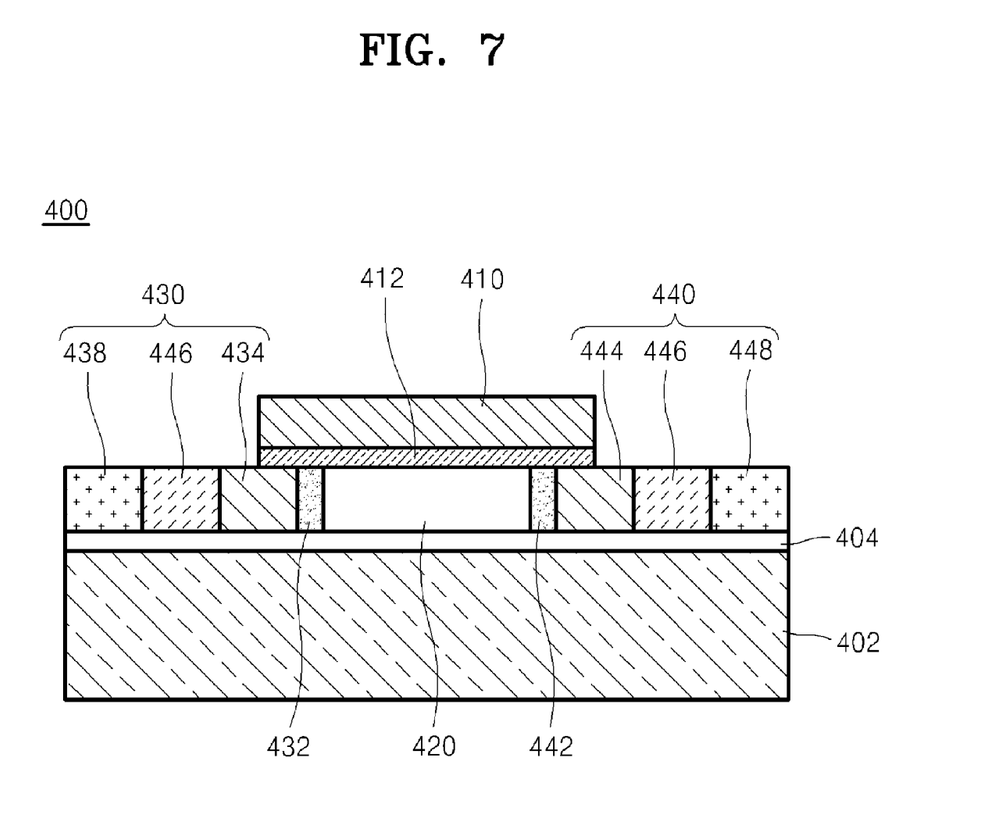
FIG. 7 is a schematic cross-sectional view of a spin transistor according to example embodiments.

FIG. 7 is a schematic cross-sectional view of a spin transistor 400 according to example embodiments.

Referring to FIG. 7, an insulating layer 404 may be formed on a substrate 402. And a source 430, a channel 420, and a drain 440 may be formed on the same plane, for example, on the insulating layer 404. A gate insulating layer 412 and a gate electrode 410 may be formed on the channel 420.

The substrate 402 may be a silicon substrate, and the insulating layer 404 may be formed of silicon oxide. The gate electrode 410 may be formed of a precious metal such as ruthenium (Ru), platinum (Pt), gold (Au), silver (Ag), titanium (Ti), or aluminum (Al), a transition metal, a rare-earth metal, or a polysilicon.

The gate insulating layer 412 may be formed of a material selected from silicon oxide, MgO, $Al_2O_3$, $ZrO_2$, and $Si_3N_4$.

A first tunnel barrier 432 may be formed between the channel 420 and the source 430, and a second tunnel barrier 442 may be formed between the channel 420 and the drain 440. The first tunnel barrier 432 and the second tunnel barrier 442 may be formed of the same material disposed between both magnetization layers in a tunneling magneto resistivity (TMR) device, for example, MgO or $Al_2O_3$.

The source 430 may be formed of a magnetic material, for example a ferromagnetic material. The source 430 may include a ferromagnetic layer 434 on the first tunnel barrier 432 and a metal layer 438 on the ferromagnetic layer 434. In addition, the source 430 may further include a anti-ferromagnetic layer 436 between the ferromagnetic layer 434 and the metal layer 438.

The drain 440 may be formed of a normal metal. In addition, the drain 440 may be formed of a magnetic material, for example, a ferromagnetic material. The drain 440 may include only a metal layer 448. The drain 440 may include a ferromagnetic layer 444 between the second tunnel barrier 442 and the metal layer 448. In addition, the drain 440 may further include a anti-ferromagnetic layer 446 between the ferromagnetic layer 444 and the metal layer 448.

The channel 420 is a passage of a spin-polarized electron between the source 430 and the drain 440. The channel 420 functions as a filter for selectively passing a spin-polarized electron having a specific direction, for example, an up-spin direction. The filtering function of the channel 420 may vary according to a voltage applied to a gate electrode 410. In this case, the spin transistor 400 may be a transistor using a field effect. The first tunnel barrier 432 filters out an electron having an undesired spin direction to prevent the electron from entering into the channel 420, and the second tunnel barrier 442 filters out an electron having an undesired spin direction to prevent the electron from entering into the drain 440 from the channel 120.

The channel 420 may be formed of the same material as the channel 120 of FIG. 1 and thus, its description will be omitted.

A half metal has a down spin electron and an up spin electron, and one spin direction electron has a semiconductor characteristic due to formation of a band gap near a Fermi level and the other spin direction electron has a metallic characteristic.

When the source 430 and the drain 440 include the ferromagnetic layers 434 and 444, respectively, the ferromagnetic layers 434 and 444 may be formed to have a spin electron with same predominant spin direction. The ferromagnetic metal may be NiFe alloy, CoFe alloy, or CoFeB alloy. The ferromagnetic layers 434 and 444 may have a density of state (DOS) higher in one spin direction than the other spin direction, for example, the density of up-spin electrons may be higher than that of down-spin electrons. However, in a normal metal, the DOS of up-spin electrons and down-spin electrons may be the same, and the drain 420 may be formed of a normal metal.

The anti-ferromagnetic layers 436 and 446 may be formed of FeMn, PtMn, or PtCrMn.

When the channel 420 is formed of a half metal and the source 430 and the drain 440 are formed of a ferromagnetic material, the channel 420 may be formed to have a semiconductor characteristic in a predominant electron spin direction of the source 430 and drain 440.

The spin transistor 400 of FIG. 7 may further include a second gate (see 260 of FIG. 4) disposed perpendicular to the gate electrode 410. The second gate electrode may be disposed above or under the gate electrode 410 and will not described in detail herein.

A method of operating the spin transistor 400 of FIG. 7 may be substantially the same as the method of operating the spin-polarized electron 100 of FIG. 1 and thus, its description will be omitted.

Meanwhile, a second gate electrode (not shown) may be formed to be disposed perpendicular to the gate electrode 410. Accordingly, the spin direction of the channel 420 is controlled by controlling the current supplied to the gate electrode 410 and the second gate electrode. The operating method of the spin transistor 400 may be substantially the same as that of the spin transistor 200 of FIG. 4 and thus, its description will be omitted.

Figure 8:
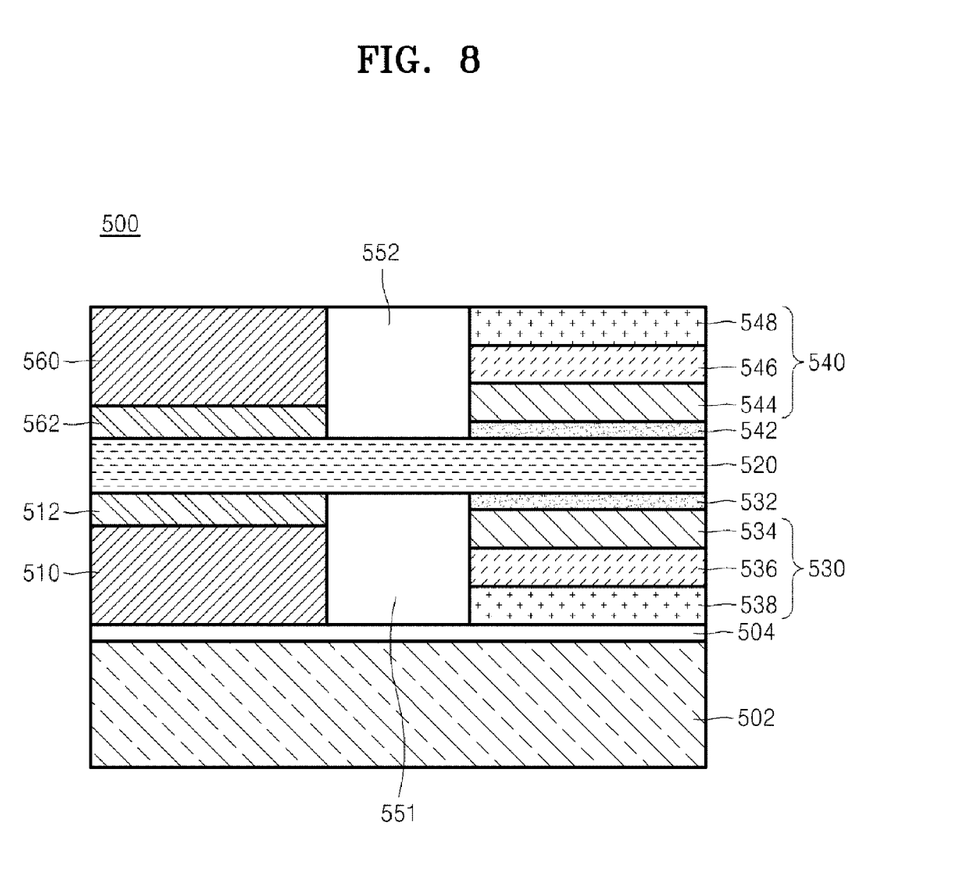
FIG. 8 is a schematic cross-sectional view of a spin transistor according to example embodiments.

FIG. 8 is a schematic cross-sectional view of a spin transistor 500 according to example embodiments.

Referring to FIG. 8, an insulating layer 504 may be formed on a substrate 502, and a first gate electrode 510 and a source 530 may be formed on the insulating layer 504. An insulating layer 551 may be disposed between the first gate electrode 510 and the source 530 to separate the first gate electrode 510 from the source 530. A first gate insulating layer 512 may be formed on the first gate electrode 510, and a first tunnel barrier 532 may be formed on the source 530.

The source 530 may include a ferromagnetic layer 534, a anti-ferromagnetic layer 536, and a metal layer 538 sequentially disposed in this order downward from the first tunnel barrier 532.

A channel 520 may be formed on the first tunnel barrier 532, the first gate insulating layer 512 and the insulating layer 551. A drain 540 and a second gate electrode 560 may be formed on the channel 520. A second gate insulating layer 562 may be disposed between the second gate electrode 560 and the channel 520. An insulating layer 552 may be disposed between the drain 540 and the second gate electrode 560 to separate the drain 540 from the second gate electrode 560.

A second tunnel barrier 542 may be further disposed between the drain 540 and the channel 520. The drain 540 may further include a ferromagnetic layer 544, a anti-ferromagnetic layer 546, and a metal layer 548 sequentially formed on the second tunnel barrier 542 in this order.

The source 530 may correspond to the drain 540 with respect to the channel 540, and the first gate electrode 510 may correspond to the second gate electrode 560 with respect to the channel 520.

A gate voltage is applied to at least one of the first gate electrode 510 and the second gate electrode 560. According to the application of the gate voltage, an electron spin moves from the source 530 to the drain 540 and thus, the spin transistor 500 is turned on. In the spin transistor 500, the pathway of the channel 520 from the source 530 to the drain 540 is short and thus, malfunctions of the spin transistor 500 caused by change in the spin direction may be reduced.

While aspects of the present invention have been particularly shown and described with reference to differing embodiments thereof, it should be understood that these exemplary embodiments should be considered in a descriptive sense only and not for purposes of limitation. Descriptions of features or aspects within each embodiment should typically be considered as available for other similar features or aspects in the remaining embodiments.

Thus, although a few embodiments have been shown and described, it would be appreciated by those of ordinary skill in the art that changes may be made in these embodiments without departing from the principles and spirit of the invention, the scope of which is defined in the claims and their equivalents.

The invention claimed is:

1. A spin transistor comprising:
   a channel formed of a magnetic material configured to selectively pass a spin-polarized electron having a specific direction;
   a source formed of a magnetic material;
   a first tunnel barrier between the channel and the source;
   a drain; and
   a gate electrode configured to control a magnetization state of the channel to selectively pass the spin-polarized electron injected from the source into the channel, wherein the source includes,
   a ferromagnetic layer on the first tunnel barrier,
   an anti-ferromagnetic layer on the ferromagnetic layer, and
   a metal layer on the anti-ferromagnetic layer.

2. The spin transistor of claim 1, wherein the channel is controlled by using an electric field generated due to a voltage applied to the gate electrode in order to control the passing of the spin-polarized electron injected from the source.

3. The spin transistor of claim 2, further comprising;
   an insulating material that electrically separates the gate electrode from the channel.

4. The spin transistor of claim 1, wherein the channel is controlled by using a magnetic field generated due to a current flowing through the gate electrode in order to control the passing of the spin-polarized electron injected from the source.

5. The spin transistor of claim 4, further comprising:
   a second gate electrode that is electrically insulated from the gate electrode and is perpendicular to the gate electrode.

6. The spin transistor of claim 1, further comprising:
   a second tunnel barrier between the channel and the drain.

7. The spin transistor of claim 6, wherein the drain comprises:
   a magnetic layer disposed on the second tunnel barrier and a metal layer disposed on the magnetic layer.

8. The spin transistor of claim 7, wherein the magnetic layer of the drain is a ferromagnetic layer.

9. The spin transistor of claim 8, wherein the drain further comprises:
   an anti-ferromagnetic layer between the ferromagnetic layer and the metal layer.

10. The spin transistor of claim 6, wherein each of the first tunnel barrier and the second tunnel barrier is formed of magnesium oxide or aluminum oxide.

11. The spin transistor of claim 1, wherein the channel is formed of a ferromagnetic material.

12. The spin transistor of claim 11, wherein the ferromagnetic material is half metal.

13. The spin transistor of claim 12, wherein the half metal comprises at least one material selected from the group consisting of a magnetic oxide, a magnetic material having a double perovskite structure, a magnetic Heusler alloy, a magnetic half Heusler alloy, and a semiconductor having a half metallic characteristic.

14. The spin transistor of claim 13, wherein the magnetic oxide is any one oxide selected from the group consisting of $CrO_2$, $Fe_3O_4$, NiO, and $TiO_2$.

15. The spin transistor of claim 13, wherein the magnetic material having the double perovskite structure is represented by $A_2BB'O_6$ where A comprises at least one selected from Ca, Sr, and Ba, B is Fe or Co, and B' is Mo or Re.

16. The spin transistor of claim 13, wherein the magnetic Heusler alloy comprises at least one compound selected from the group consisting of $X_2YZ$, $X_2YZ'$, $X_2Y'Z$, and $X_2Y'Z'$ where X comprises at least one selected from Co, Fe, and Ru, Y is Cr or Mn, and Z is any one selected from Si, Ge, Sn, Al, Ga, Sb, and Pb.

17. The spin transistor of claim 13, wherein the magnetic half Heusler alloy is any one compound selected from the group consisting of NiMnSb, PdMnSb, PtMnSb, CoMnSb, IrMnSb, NiCrSb, FeMnSb, CoCrSb, NiVSb, CoVSb, CoTiSb, NiMnSe, NiMnTe, CoFeSb, NiFeSb, and RhMnSb.

18. The spin transistor of claim 13, wherein the semiconductor having the half metallic characteristic is any one material selected from CrAs, MnAs, and CrSe.

19. The spin transistor of claim 11, wherein the channel is formed of any one material selected from the group consisting of CoFe, CoFeB, Fe, Co, Mn, Permalloy.

20. The spin transistor of claim 11, wherein the channel is formed of a diluted magnetic semiconductor material prepared by doping a semiconductor with a transition metal to obtain a magnetic characteristic.

21. The spin transistor of claim 20, wherein the diluted magnetic semiconductor material is any one material selected from the group consisting of (In,Mn)As, (Ga,Mn)As, (Zn,Co)O, (Zn,V)O, (Ga,Mn)N, (Ga,Cr)N, (Cd,Mn)$GeP_2$, (Zn,Mn)$GeP_2$, (Ti,Cr)$O_2$, and (Zn,Cr)Se.

22. The spin transistor of claim 1, wherein the channel, the source, and the drain are disposed on the same plane.

23. The spin transistor of claim 6, wherein the first tunnel barrier is separated from the second tunnel barrier on the channel, and the source and the drain are respectively disposed on the first tunnel barrier and the second tunnel barrier.

24. The spin transistor of claim 6, wherein the source, the channel, and the drain are disposed vertically to a substrate.

25. The spin transistor of claim 24, wherein the first tunnel barrier and the second tunnel barrier are disposed corresponding to each other on opposite surfaces of the channel, the source and the drain are respectively disposed on the first tunnel barrier and the second tunnel barrier, and
the gate electrode comprises a first gate electrode separated from the source on the channel and a second gate electrode separated from the drain on the channel.

26. A method of operating the spin transistor of claim 1, the method comprising:
injecting spin-polarized electrons from the source; and
controlling the magnetization state of the channel by applying an electric field or a magnetic field to the channel to selectively pass the spin-polarized electrons.

27. The method of claim 26, wherein the controlling operation is to apply a predetermined voltage to the gate electrode.

28. The method of claim 26, wherein the controlling operation is to apply a predetermined voltage to each of the gate electrode and a second gate electrode disposed above the gate electrode to be perpendicular to the gate electrode.

29. The method of claim 26, wherein the channel passes, among the spin-polarized electrons injected from the source, only an spin electron having a specific spin direction, according to the magnetization state of the channel.

* * * * *